(12) United States Patent
Aoki et al.

(10) Patent No.: US 10,880,994 B2
(45) Date of Patent: Dec. 29, 2020

(54) TOP-SIDE CONNECTOR INTERFACE FOR PROCESSOR PACKAGING

(71) Applicant: Intel Corporation, Santa Clara, CA (US)

(72) Inventors: Russell S. Aoki, Tacoma, WA (US); Jeffory L. Smalley, East Olympia, WA (US); Jonathan W. Thibado, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 826 days.

(21) Appl. No.: 15/172,102

(22) Filed: Jun. 2, 2016

(65) Prior Publication Data
US 2017/0354031 A1 Dec. 7, 2017

(51) Int. Cl.
*H01R 9/00* (2006.01)
*H05K 1/02* (2006.01)
(Continued)

(52) U.S. Cl.
CPC .............. *H05K 1/0271* (2013.01); *G06F 1/16* (2013.01); *G06F 1/206* (2013.01);
(Continued)

(58) Field of Classification Search
CPC . G06F 1/16; G06F 1/206; H01L 2224/16145; H01L 2224/73204; H01L 2225/06513; H01L 2225/0652; H01L 23/49833; H01L 24/13; H01L 24/16; H01L 24/17; H01L 25/0657; H01L 2924/1431; H01L 2924/1432; H01L 2924/1433; H01L 2924/1434; H01L 2924/15311; H01L 2924/15313; H01L 2924/15323; H05K 1/0212; H05K 1/0271; H05K 1/144; H05K 1/181; H05K 2201/041;
(Continued)

(56) References Cited

U.S. PATENT DOCUMENTS

| 4,434,321 A | 2/1984 | Betts |
| 4,481,403 A | 11/1984 | Del Monte |

(Continued)

FOREIGN PATENT DOCUMENTS

| JP | 05175659 | 7/1993 |
| JP | 06291165 | 10/1994 |

(Continued)

OTHER PUBLICATIONS

International Search Report and Written Opinion for International Patent Application No. PCT/US2016/035597, dated Sep. 20, 2016.
(Continued)

*Primary Examiner* — Yuriy Semenenko
(74) *Attorney, Agent, or Firm* — Green, Howard & Mughal LLP.

(57) ABSTRACT

An apparatus is provided which comprises: a processor die; a processor substrate having a region extended away from the processor die, wherein the processor die is mounted on the processor substrate, wherein the extended region has at least one signal interface which is connectable to a top-side connector; and an interposer coupled to the processor substrate and a motherboard.

13 Claims, 10 Drawing Sheets

(51) Int. Cl.
   *G06F 1/20* (2006.01)
   *G06F 1/16* (2006.01)
   *H01L 23/498* (2006.01)
   *H01L 23/00* (2006.01)
   *H05K 1/18* (2006.01)
   *H05K 3/34* (2006.01)
   *H01L 25/065* (2006.01)
   *H05K 1/14* (2006.01)
   *H05K 3/36* (2006.01)

(52) U.S. Cl.
   CPC ........ *H01L 23/49833* (2013.01); *H01L 24/17* (2013.01); *H05K 1/0212* (2013.01); *H05K 1/181* (2013.01); *H05K 3/341* (2013.01); *H05K 3/3494* (2013.01); *H01L 24/13* (2013.01); *H01L 24/16* (2013.01); *H01L 25/0657* (2013.01); *H01L 2224/16145* (2013.01); *H01L 2224/73204* (2013.01); *H01L 2225/0652* (2013.01); *H01L 2225/06513* (2013.01); *H01L 2924/1431* (2013.01); *H01L 2924/1432* (2013.01); *H01L 2924/1433* (2013.01); *H01L 2924/1434* (2013.01); *H01L 2924/15311* (2013.01); *H01L 2924/15313* (2013.01); *H01L 2924/15323* (2013.01); *H05K 1/144* (2013.01); *H05K 3/3436* (2013.01); *H05K 3/368* (2013.01); *H05K 2201/041* (2013.01); *H05K 2201/10189* (2013.01); *H05K 2201/10325* (2013.01); *H05K 2201/10378* (2013.01); *H05K 2201/10409* (2013.01); *H05K 2201/10734* (2013.01)

(58) Field of Classification Search
   CPC .......... H05K 2201/10189; H05K 2201/10325; H05K 2201/10378; H05K 2201/10409; H05K 2201/10734; H05K 3/341; H05K 3/3436; H05K 3/3494; H05K 3/368
   See application file for complete search history.

(56) References Cited

U.S. PATENT DOCUMENTS

| | | | |
|---|---|---|---|
| 4,730,238 | A | 3/1988 | Cook |
| 5,220,491 | A | 6/1993 | Sugano et al. |
| 5,513,076 | A | 4/1996 | Werther |
| 5,539,186 | A | 7/1996 | Abrami et al. |
| 5,615,477 | A | 4/1997 | Sweitzer |
| 5,622,770 | A | 4/1997 | Dowdy et al. |
| 5,859,407 | A | 1/1999 | Saiki et al. |
| 5,965,944 | A | 10/1999 | Frankoski et al. |
| 6,002,168 | A | 12/1999 | Bellaar et al. |
| 6,181,004 | B1 | 1/2001 | Koontz et al. |
| 6,396,706 | B1 | 5/2002 | Wohlfarth |
| 6,853,061 | B2* | 2/2005 | Frutschy ............... H01L 23/50 257/678 |
| 7,474,540 | B1* | 1/2009 | Dang ................ H01L 23/147 174/250 |
| 7,510,176 | B2 | 3/2009 | Oda et al. |
| 7,511,228 | B2 | 3/2009 | Yaung et al. |
| 8,411,442 | B2 | 4/2013 | Meinel et al. |
| 8,436,491 | B2 | 5/2013 | Walley et al. |
| 8,519,304 | B2 | 8/2013 | Bartley et al. |
| 8,981,259 | B2 | 3/2015 | Chou |
| 9,012,811 | B2 | 4/2015 | White |
| 9,468,089 | B2 | 10/2016 | Sasaki et al. |
| 9,983,372 | B2 | 5/2018 | Oomori et al. |
| 2003/0156400 | A1* | 8/2003 | Dibene, II ............ G06F 1/18 361/803 |
| 2003/0198033 | A1 | 10/2003 | Panella et al. |
| 2004/0195701 | A1 | 10/2004 | Attarwala |
| 2004/0232535 | A1 | 11/2004 | Tarn |
| 2006/0065431 | A1 | 3/2006 | Trucco |
| 2006/0231541 | A1 | 10/2006 | Takada et al. |
| 2006/0240658 | A1 | 10/2006 | Narkhede et al. |
| 2007/0296071 | A1 | 12/2007 | Chiu et al. |
| 2008/0246138 | A1 | 10/2008 | Gerber |
| 2009/0121346 | A1 | 5/2009 | Wachtler |
| 2009/0221164 | A1 | 9/2009 | Kobayashi et al. |
| 2010/0078781 | A1 | 4/2010 | Ganesan et al. |
| 2011/0237001 | A1 | 9/2011 | Hasebe et al. |
| 2012/0199830 | A1 | 8/2012 | Raravikar et al. |
| 2013/0250562 | A1* | 9/2013 | Tanaka ................ H05K 1/0201 362/184 |
| 2014/0210076 | A1 | 1/2014 | Aliane |
| 2014/0217571 | A1 | 8/2014 | Ganesan et al. |
| 2014/0220737 | A1 | 8/2014 | Aliane |
| 2014/0268577 | A1* | 9/2014 | Swaminathan ...... H05K 1/0204 361/719 |
| 2014/0307406 | A1 | 10/2014 | Kitajima |
| 2015/0003841 | A1 | 1/2015 | McLaren et al. |
| 2015/0016083 | A1 | 1/2015 | Nootens et al. |
| 2015/0114707 | A1 | 4/2015 | Glickman |
| 2015/0118870 | A1* | 4/2015 | Swaminathan ...... H01R 12/716 439/65 |
| 2015/0194413 | A1 | 7/2015 | Lee et al. |
| 2015/0234348 | A1 | 8/2015 | Fujita et al. |
| 2015/0235986 | A1 | 8/2015 | Interrante et al. |
| 2016/0093588 | A1 | 3/2016 | Wang et al. |
| 2016/0183374 | A1* | 6/2016 | Prakash ................ H05K 1/181 361/719 |
| 2016/0216445 | A1* | 7/2016 | Thacker ............ G02B 6/12004 |
| 2016/0351526 | A1 | 12/2016 | Boyd et al. |
| 2017/0176260 | A1 | 6/2017 | Ferguson et al. |
| 2017/0178994 | A1 | 6/2017 | Hui et al. |

FOREIGN PATENT DOCUMENTS

| | | |
|---|---|---|
| JP | 08330686 | 12/1996 |
| JP | 083330686 | 12/1996 |
| JP | 10041606 | 2/1998 |
| JP | 2003106896 | 4/2003 |
| JP | 3942952 | 7/2007 |
| JP | 2011044512 | 3/2011 |
| JP | 2012160602 | 8/2012 |
| WO | 2015152855 | 10/2015 |
| WO | 2016048352 | 3/2016 |
| WO | 2017112134 | 6/2017 |
| WO | 2017112135 | 6/2017 |
| WO | 2017112136 | 6/2017 |
| WO | 2017112163 | 6/2017 |

OTHER PUBLICATIONS

International Preliminary Report on Patentability for International Patent Application No. PCT/US16/62143, dated Jun. 26, 2018.
International Preliminary Report on Patentability for International Patent Application No. PCT/US17/30104, dated Dec. 13, 2018.
Notice of Allowance for U.S. Appl. No. 14/975,941, dated Sep. 5, 2018.
International Search Report and Written Opinion for International Patent Application No. PCT/US2016/062143 dated Feb. 15, 2017.
International Search Report and Written Opinion for International Patent Application No. PCT/US2017/030104 dated Sep. 25, 2017.
Office Action for U.S. Appl. No. 14/975,941 notified Jul. 3, 2017.
Final Office Action for U.S. Appl. No. 14/975,941, notified on Oct. 20, 2017.
International Preliminary Report on Patentability for International Patent Application No. PCT/US16/33597, dated Jul. 5, 2018.
International Search Report and Written Opinion for International Patent Application No. PCT/US16/62143, dated Feb. 15, 2017.
Office Action for U.S. Appl. No. 14/975,941, notified Apr. 25, 2018.
Office Action for U.S. Appl. No. 15/777,860, notified Jun. 17, 2019.
Final Office Action for U.S. Appl. No. 15/777,860, notified Oct. 21, 2019, 17 pgs.
Advisory Action for U.S. Appl. No. 15/777,860, notified Jan. 8, 2020.

(56) References Cited

OTHER PUBLICATIONS

Extended European Search Report for European Patent Application No. 17807170.0, dated Jan. 15, 2020.

* cited by examiner

TOP-SIDE CONNECTOR INTERFACE FOR PROCESSOR PACKAGING

CROSS REFERENCE TO RELATED APPLICATION

The present application is related to U.S. application Ser. No. 14/975,941, titled "Warpage Mitigation in Printed Circuit Board Assemblies," filed Dec. 21, 2015, which is incorporated by reference in its entirety.

BACKGROUND

Accessing signals from an integrated circuit generally involves routing the signals through a processor substrate, package, motherboard, etc., and then to interfaces on the motherboard. Connectors can also be used to interface with the motherboard to access the signal routes. However, connectors are bulky and present a challenge to interface with the integrated circuit directly.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Land grid array (LGA) is a type of packaging for integrated circuits (ICs). LGA sockets have a solder ball on one side of the socket that is attached to a cantilever contact. The cantilever contact is the interface point to the LGA package. The LGA package has an array of conductive pads that the LGA socket cantilever contact makes electrical contact with.

Figure 1:
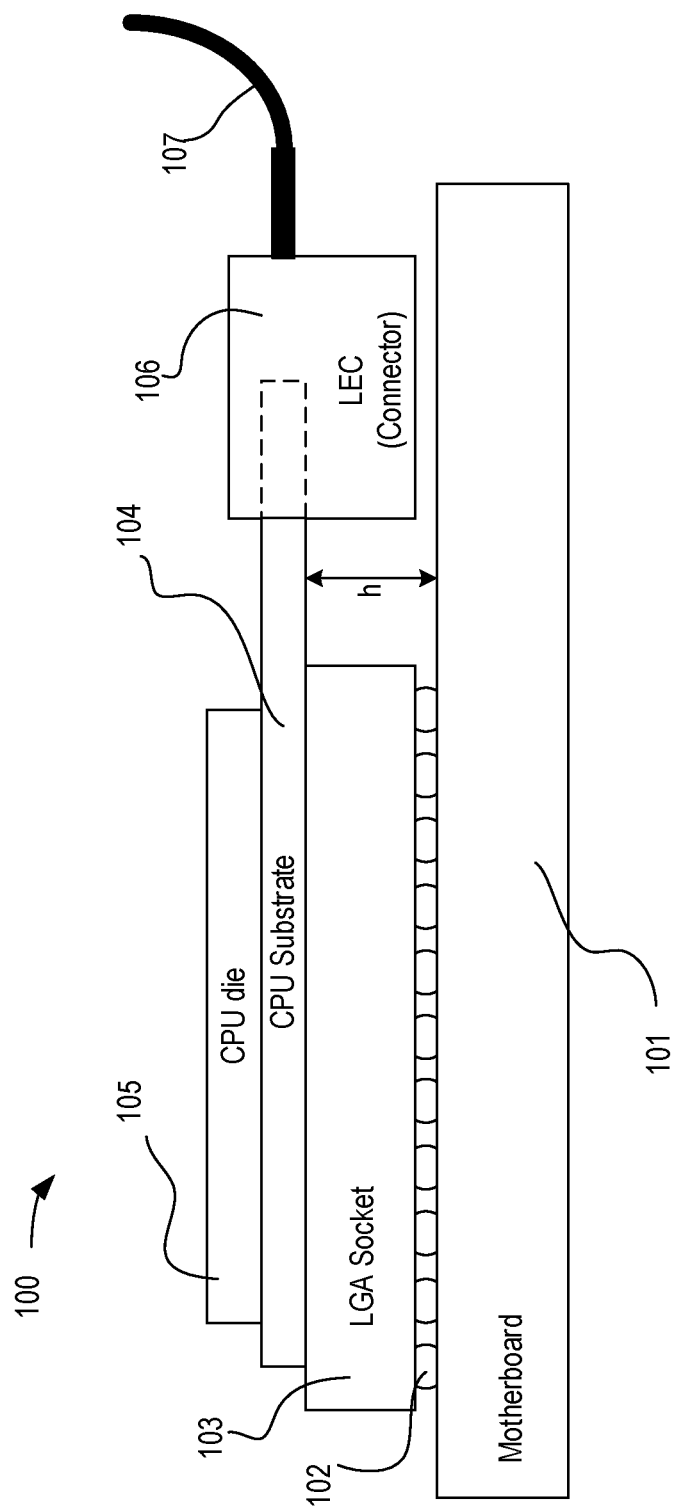
FIG. 1 illustrates a cross-sectional view of a packaging system with a Linear Edge Connector (LEC) for accessing signals from a processor substrate coupled to a Land Grid Array (LGA) socket.

FIG. 1 illustrates cross-sectional view 100 of a packaging system with a Linear Edge Connector (LEC) for accessing signals from a processor substrate coupled to an LGA socket. The packaging system of FIG. 1 comprises motherboard 101, array of contacts 102, LGA socket 103, CPU (central processing unit, or any processor) substrate 104, CPU die 105, LEC connector 106, and fabric interconnect cable 107. The array of contacts 102 may be ball grid array (BGA) balls that make contact between LGA Socket 103 and motherboard 101 (e.g., printed circuit board PCB)). A person skilled in the art would appreciate that other details such as cantilever contacts interfacing with the CPU Substrate 104 are not shown, but are present. Here, LEC 106 couples to CPU substrate 104 to provide access to signal routing from CPU die 105. These signal routings may also be extending towards motherboard 101 (e.g., PCB) via LGA Socket 103. LGA Socket 103 separates CPU die 105 from motherboard 101 by a height 'h' which is high enough for allowing LEC 106 to couple with an extended region of CPU substrate 104.

As computing platforms scale in size and computing devices become smaller in form factor, LGA sockets for their bulky nature become less attractive as a design choice. Computing platforms that are moving towards thinner packaging technologies such as Ball Grid Array (BGA) packaging, which is generally thinner than LGA socket 103, cannot use LEC 106 to communicatively couple to CPU substrate 104 because the thinner BGA packaging results in lower 'h' than the 'h' shown in FIG. 1. As such, connectors such as LEC 106 cannot access signal routings on CPU substrate 104 because there is not enough clearance for LEC 106 to couple to CPU substrate 104.

Some embodiments provide an electro-mechanical interface between a top-side connector and a processor package (e.g., BGA package). In some embodiments, an apparatus is provided which comprises a processor substrate having a region extended away from a processor die, where the processor die is mounted on the processor substrate, and where the extended region has at least one signal interface which is connectable to a top-side connector. In some embodiments, an apparatus is provided which comprises an interposer coupled to the processor substrate and a motherboard, where the interposer has a region which is extended away from the processor substrate, where the extended region of the interposer has at least one signal path communicatively coupled to the processor die, and where the extended region of the interposer is connectable to a top-side connector. The various embodiments allow one or more top-side connectors to provide an access to processor signal routings. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 2:
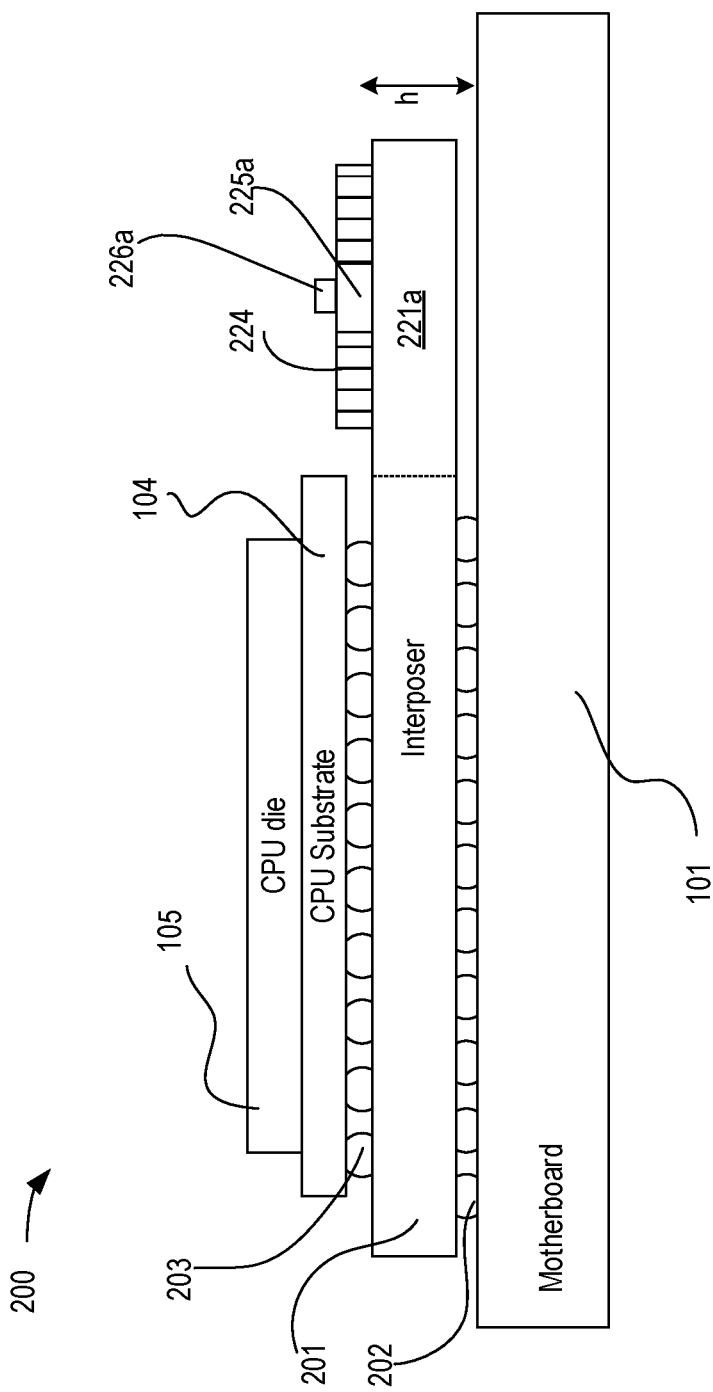
FIG. 2 illustrates a cross-sectional view of a packaging system with an interposer having an extended region to couple to top-side connector, according to some embodiments of the disclosure.

FIG. 2 illustrates cross-sectional view 200 of a packaging system with an interposer having an extended region to couple to a top-side connector, according to some embodiments of the disclosure. It is pointed out that those elements of FIG. 2 having the same reference numbers (or names) as the elements of any other figure can operate or function in any manner similar to that described, but are not limited to such.

Packaging system 200 of FIG. 2 comprises motherboard 101 (e.g., PCB), interposer 201, interposer-to-PCB contacts 202 (e.g., solder balls), interposer-to-substrate contacts 203 (e.g., solder balls), CPU substrate 104, CPU die 105, and top-side connector 224. While the various embodiments here are illustrated with reference to a CPU being the processor die, any processor or integrated circuit die can be used instead of CPU die 105. For example, the processor die may be a digital signal processor die, a radio frequency integrated circuit die, etc.

In some embodiments, interposer 201 has an extended region 221a which is extended away from CPU substrate 104. In some embodiments, the extended region 221a of interposer 201 has at least one signal path communicatively coupled to CPU die 105. In some embodiments, the extended region 221a of interposer 201 is connectable to a top-side connector 224. In some embodiments, top-side connector has a region 225a which is used to couple top-side connector 224 to the extended region 221a via fasteners 226a (e.g., screws). In some embodiments, top-side connector 224 is a male part which connects to a corresponding female part (e.g., a flexible interconnect fabric). In some embodiments, top-side connector 224 is a female part which connects to a corresponding male part (e.g., a flexible interconnect fabric). Top-side connector 224 can access processor signal routings directly instead of accessing them via motherboard 101, in accordance with some embodiments. As such, top-side connector 224 of various embodiments can be used for accessing high-speed input-output (HSIO) signals because delay path for these signals is shortened via top-side connector 224.

In some embodiments, interposer 201 provides the routing between CPU substrate 104 and motherboard 101. For example, interposer 201 widens the pitch of contacts 203 to a wider pitch of contacts 202 to reroute connections from CPU substrate 104 to a different connection. In some embodiments, interposer 201 is a Reflow Grid Array (RGA) which has embedded heaters. In some embodiments, RGA allows the BGA package to be reflowed to interposer 201. RGA of various embodiments can also be used to control warpage and monitor temperature of the RGA.

Thermal mismatch between materials used in a motherboard can cause deformation of the motherboard, resulting in stress to solder joints and complications during manufacturing and assembly (e.g., during package and component attach phases). Conventionally, mechanical frames and clamps are used to prevent warping in some motherboards. The embedded heaters in interposer 201 can provide local heat to reflow to solder balls 203, and as such mitigate the warping of motherboard 101, in accordance with some embodiments. In some embodiments, heater traces are provided within motherboard 101 to selectively heat portions of motherboard 101 to maintain a uniform temperature profile across motherboard 101. This uniform temperature profile may result in uniform thermal expansion of motherboard 101. As such, warpage risk and degree is reduced.

In some embodiments, interposer 201 may also include one or more heater traces and/or temperature sensors to monitor the heat reflow through interposer 201. In some embodiments, different layers in interposer 201 including heater traces and/or traces for temperature sensors are spaced apart by insulator layers (e.g., formed of dielectric material). The insulator layers may include vias to electrically couple different metal layers. In some embodiment, interposer 201 may include one or more metal planes that may act as heat spreaders and may assist in achieving a uniform temperature profile across interposer 201. The various embodiments described here are not limited to RGA for interposer 201. In some embodiments, interposers without embedded heaters can be used.

Interposer 201 of the various embodiments may be formed of a variety of materials. For example, interposer 201 may be formed of an epoxy resin, a fiberglass-reinforced epoxy resin, a ceramic material, or a polymer material such as polyimide. In some embodiments, interposer 201 may be formed of alternate rigid or flexible materials, such as silicon, germanium, and other group III-V and group IV materials of the Periodic Table. In some embodiments, interposer 201 may include metal interconnects and vias including but not limited to through-silicon vias (TSVs). In some embodiments, interposer 201 may include embedded devices including both passive and active devices. Such devices may include, but are not limited to, capacitors, decoupling capacitors, resistors, inductors, fuses, diodes, transformers, sensors, electrostatic discharge (ESD) devices, and memory devices. In some embodiments, interposer 201 may include complex devices such as radio-frequency (RF) devices, power amplifiers, power management devices, antennas, arrays, sensors, and microelectromechanical systems (MEMS) devices, etc.

In some embodiments, CPU substrate 104 is a multi-layer substrate with signal, power, and ground routings distributed in various layers. In some embodiments, these signal, power, and ground routings pass through interposer 201 and are also accessible to top-side connector 224. Any known suitable material can be used for forming CPU substrate 104.

Figure 3:
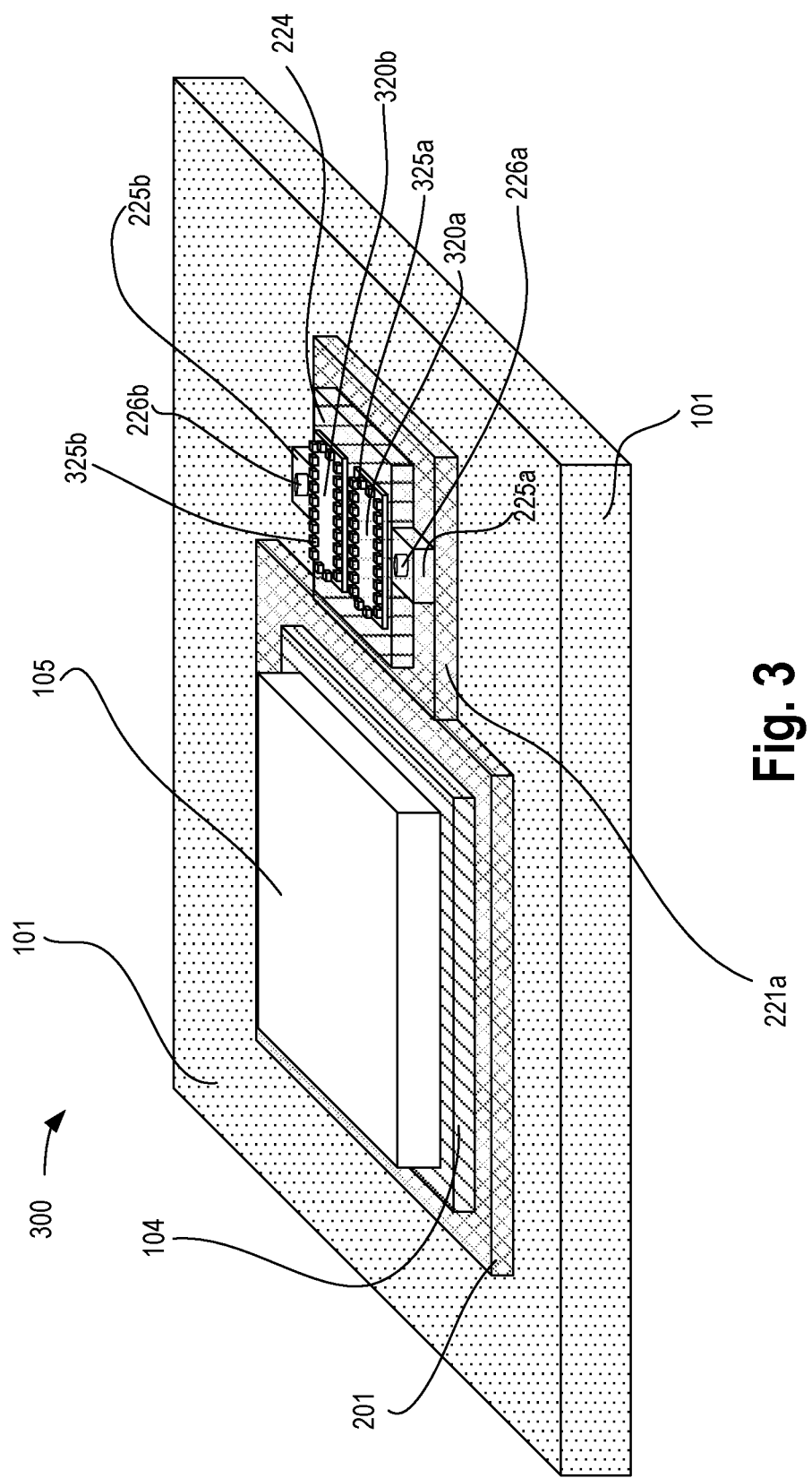
FIG. 3 illustrates a perspective view of the packaging system of FIG. 2, according to some embodiments of the disclosure.

FIG. 3 illustrates perspective view 300 of the packaging system of FIG. 2, according to some embodiments of the disclosure. It is pointed out that those elements of FIG. 3 having the same reference numbers (or names) as the elements of any other figure can operate or function in any manner similar to that described, but are not limited to such.

Perspective view 300 illustrates top-side connector 224 having two connection regions 320a and 320b, respectively. These connection regions have connectors 325a and 325b which are used to couple to another device (e.g., a flexible interconnect fabric). In some embodiments, both connectors 325a and 325b are male connectors. In some embodiments, both connectors 325a and 325b are female connectors. In some embodiments, one of the connectors (e.g., 325a) is a female connector and the other connector (e.g., 325b) is male connector. These connectors are electrically connected to signal routings from CPU die 105 via CPU substrate 104 and interposer 201. In some embodiments, top-side connector 224 is fastened to the extended region 221a of interposer 201 via fasteners (e.g., screws) 226a and 226b which are insert-able in their respective regions 225a and 225b. While perspective view 300 illustrates one top-side connector 224 coupling to one side of interposer 201, top-side connectors can be coupled to other sides of interposer 201. For example, the packing system may include extended interposer regions along the north, west, and/or south sides of interposer 201, and these extended regions may couple to their respective connectors.

Figure 4:
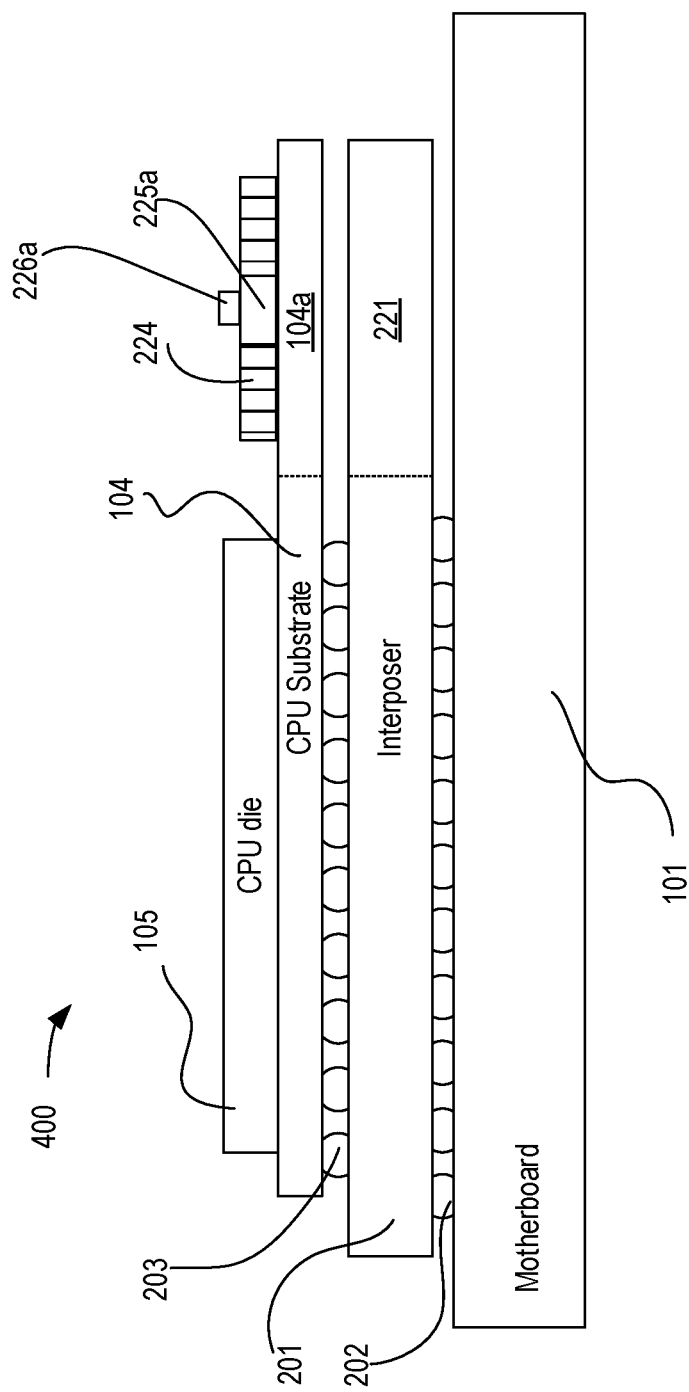
FIG. 4 illustrates a cross-sectional view of a packaging system with a processor substrate having an extended region to couple to a top-side connector, according to some embodiments of the disclosure.

FIG. 4 illustrates cross-sectional view 400 of a packaging system with a processor substrate having an extended region to couple to a top-side connector, according to some embodiments of the disclosure. It is pointed out that those elements of FIG. 4 having the same reference numbers (or names) as the elements of any other figure can operate or function in any manner similar to that described, but are not limited to such.

In some embodiments, CPU substrate 104 is elongated along the direction of motherboard 101 and top-side connector 224 to mechanically couple with it. The extended region of CPU substrate 104 is region 104a. In some embodiments, CPU substrate 104 is a multi-layer substrate with signal, power, and ground routings distributed in various layers. In some embodiments, these signal, power, and ground routings pass through interposer 201 and are also accessible by top-side connector 224. Any known suitable material can be used for forming CPU substrate 104. In some embodiments, interposer 201 is extended at least as much as the extended CPU substrate 104 to provide mechanical strength to the extended region 104a of CPU substrate 104. The extended region of interposer 201 is 221. In some embodiments, top-side connector 224 has a region 225a which is used to couple top-side connector 224 to the extended region 104a via fasteners 226a (e.g., screws). In some embodiments, top-side connector 224 is a male part which connects to a corresponding female part (e.g., a flexible interconnect fabric). In some embodiments, top-side connector 224 is a female part which connects to a corresponding male part (e.g., a flexible interconnect fabric).

Figure 5:
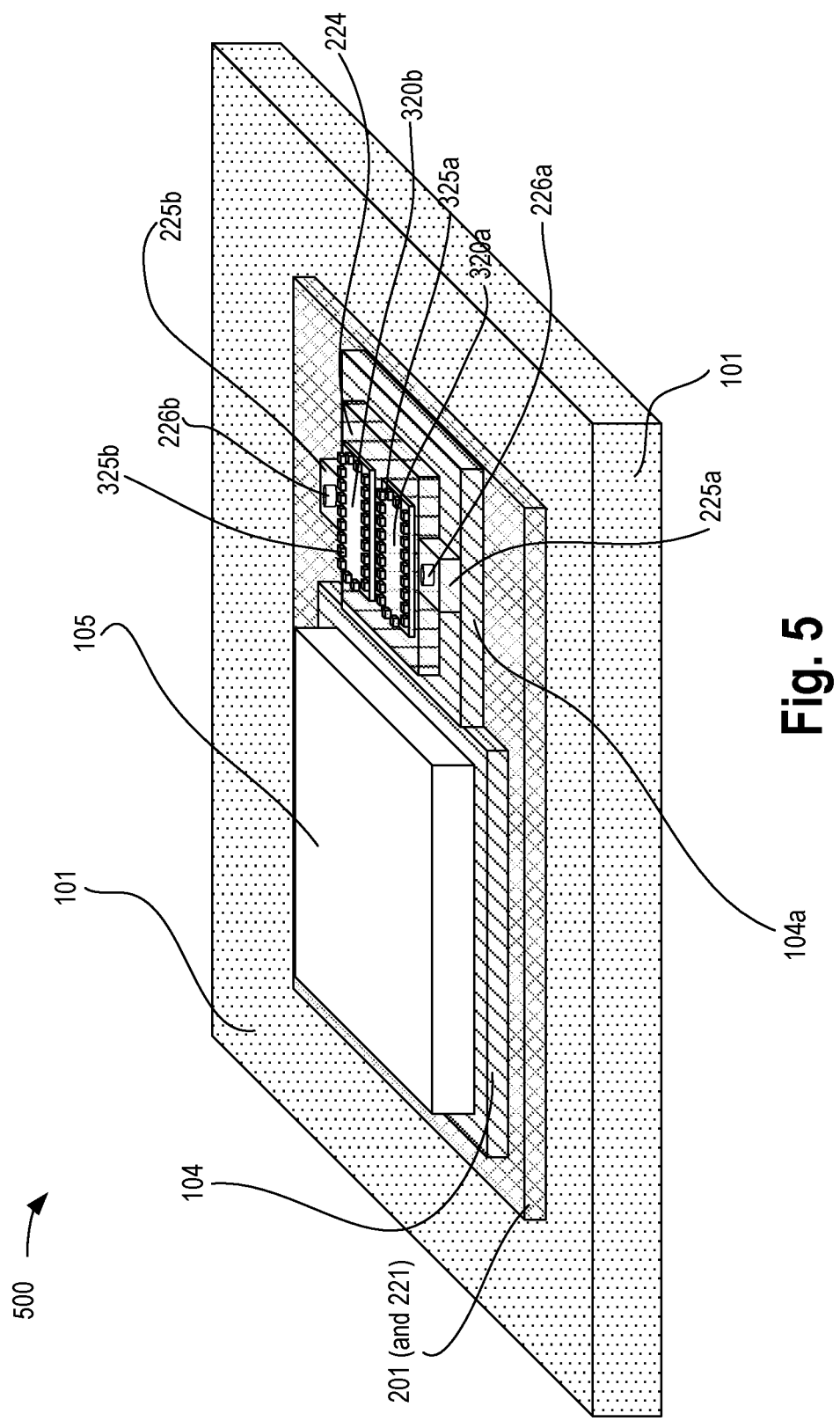
FIG. 5 illustrates a perspective view of the packaging system of FIG. 4, according to some embodiments of the disclosure.

FIG. 5 illustrates perspective view 500 of the packaging system of FIG. 4, according to some embodiments of the disclosure. It is pointed out that those elements of FIG. 5 having the same reference numbers (or names) as the elements of any other figure can operate or function in any manner similar to that described, but are not limited to such.

Perspective view 500 illustrates top-side connector 224 having two connection regions 320a and 320b, respectively, which attach to extended CPU substrate region 104a. These connection regions have connectors 325a and 325b which are used to couple to another device (e.g., a flexible interconnect fabric). In some embodiments, both connectors 325a and 325b are male connectors. In some embodiments, both connectors 325a and 325b are female connectors. In some embodiments, one of the connectors (e.g., 325a) is a female connector and the other connector (e.g., 325b) is male connector. These connectors are electrically connected to signal routings from CPU die 105 via CPU substrate 104 and extended region 104a. In some embodiments, connector 225 is fastened to the extended region 104a of CPU substrate 104 via fasteners (e.g., screws) 226a and 226b which are insert-able in their respective regions 225a and 225b. While perspective view 500 illustrates one top-side connector 224 coupling to one side of CPU substrate 104, top-side connectors can be coupled to other sides of CPU substrate 104. For example, the packing system may include extended substrate regions along the north, west, and/or south sides of CPU substrate 104, and these extended regions may couple to their respective connectors.

Figure 6:
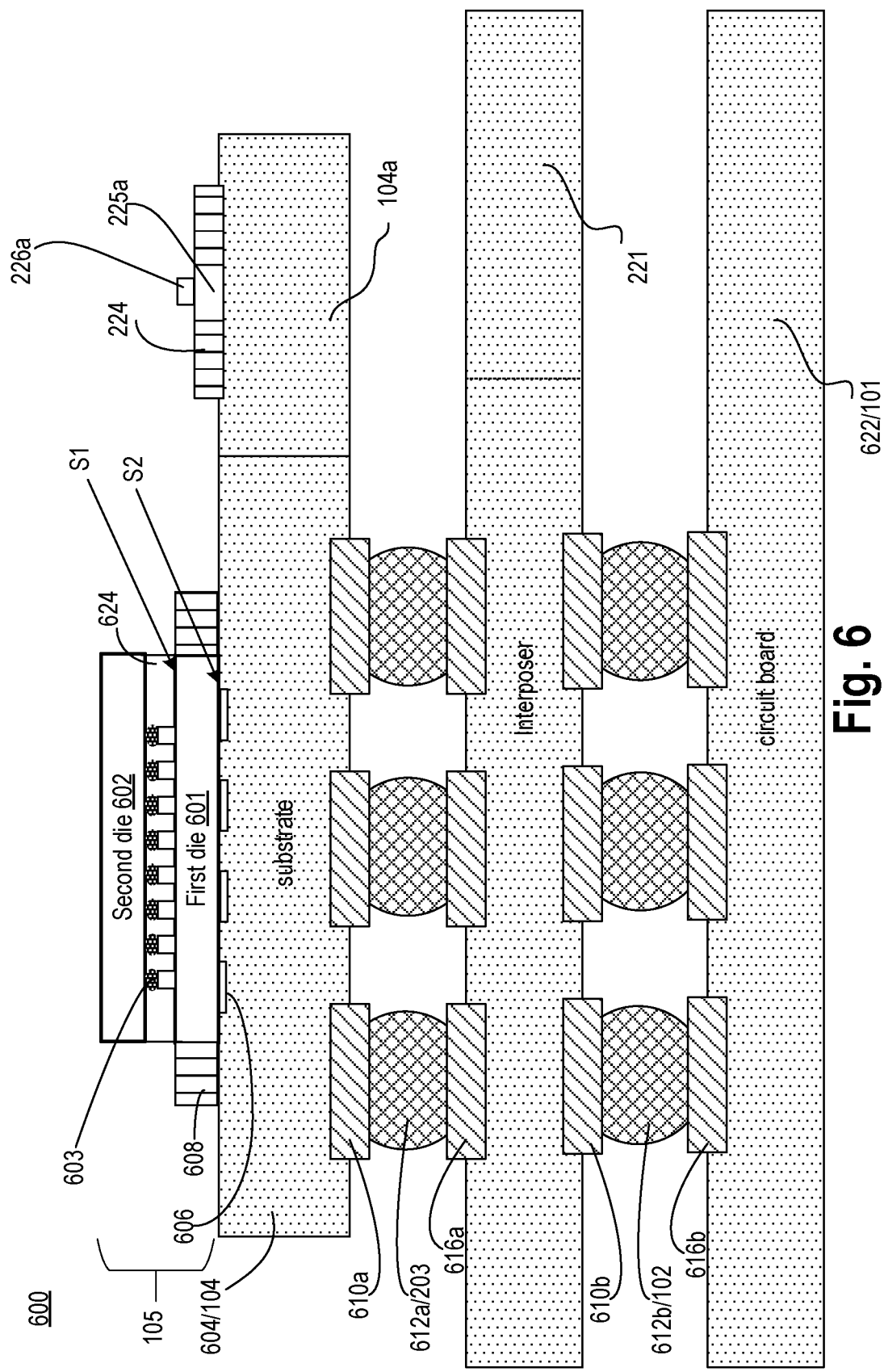
FIG. 6 illustrates a cross-sectional view of an integrated circuit (IC) package assembly which is configured to be coupled to a top-side connector, in accordance with various embodiments.

FIG. 6 illustrates cross-sectional view 600 of an integrated circuit (IC) package assembly which is configured to be coupled to a top-side connector, in accordance with various embodiments. It is pointed out that those elements of FIG. 6 having the same reference numbers (or names) as the elements of any other figure can operate or function in any manner similar to that described, but are not limited to such.

In some embodiments, IC package assembly may include First die 601, package substrate 604/104, interposer 201 (and 221), and circuit board 622/101. IC package assembly of cross-sectional view 600 is one example of a stacked die configuration in which First die 601 is coupled to package substrate 604/104, and Second die 602 is coupled with First die 601, in accordance with some embodiments.

In some embodiments, First die 601 may have a first side S1 and a second side S2 opposite to the first side S1. In some embodiments, the first side S1 may be the side of the die commonly referred to as the "inactive" or "back" side of the die. In some embodiments, the second side S2 may include one or more transistors, and may be the side of the die commonly referred to as the "active" or "front" side of the die. In some embodiments, second side S2 of First die 601 may include one or more electrical routing features 606. In some embodiments, second die 602 may include an "active" or "front" side with one or more electrical routing features

606. In some embodiments, electrical routing features 606 may be bond pads (e.g., formed from a combination of bumps 602*a* and solder balls 603*a*).

In some embodiments, Second die 602 may be coupled to First die 601 in a front-to-back configuration (e.g., the "front" or "active" side of Second die 602 is coupled to the "back" or "inactive" side S1 of First die 601). In some embodiments, dies may be coupled with one another in a front-to-front, back-to-back, or side-to-side arrangement. In some embodiments, one or more additional dies may be coupled with First die 601, Second die 602, and/or with package substrate 604/104. Other embodiments may lack Second die 602. In some embodiments, First die 601 may include one or more TSVs. In some embodiments, Second die 602 is coupled to First die 601 by die interconnects formed from combination of bumps and solder balls 603. In some embodiments, solder balls 603 are formed using the solder-on-die (SOD) process.

In some embodiments, inter-die interconnects may be solder bumps, copper pillars, or other electrically conductive features. In some embodiments, an interface layer 624 may be provided between First die 601 and Second die 602. In some embodiments, interface layer 624 may be; or may include, a layer of under-fill, adhesive, dielectric, or other material. In some embodiments, interface layer 624 may serve various functions, such as providing mechanical strength, conductivity, heat dissipation, or adhesion.

In some embodiments, First die 601 and Second die 602 may be single dies e.g., First die 601 is a single die instead of multiple dies). In other embodiments, First die 601 and/or Second die 602 may include two or more dies. For example, in some embodiments First die 601 and/or Second die 602 may be a wafer (or portion of a wafer) having two or more dies formed on it. In some embodiments, First die 601 and/or Second die 602 includes two or more dies embedded in an encapsulant. In some embodiments, the two or more dies are arranged side-by-side, vertically stacked, or positioned in any other suitable arrangement. In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

In some embodiments, First die 601 and/or Second die 602 may be a primary logic die. In some embodiments, First die 601 and/or Second die 602 may be configured to function as memory, an application specific circuit (ASIC), a processor, or some combination of such functions. For example, First die 601 may include a processor and Second die 602 may include memory. In some embodiments, one or both of First die 601 and Second die 602 may be embedded in encapsulant 608. In some embodiments, encapsulant 608 can be any suitable material, such as an Ajinomoto Film (ABF) substrate, other dielectric/organic materials, resins, epoxies, polymer adhesives, silicones, acrylics, polyimides, cyanate esters, thermoplastics, and/or thermosets.

In some embodiments, First die 601 may be coupled to package substrate 604/104 (e.g., CPU substrate). In some embodiments, package substrate 604 may be a careless substrate. For example, package substrate 604 may be a bumpless build-up layer (BMA) assembly that includes a plurality of "bumpless" build-up layers. Here, the term "bumpless build-up layers" generally refers to layers of substrate and components embedded therein without the use of solder or other attaching means that may be considered "bumps."

In some embodiments, the one or more build-up layers may have material properties that may be altered and/or optimized for reliability, warpage reduction, etc. In some embodiments, package substrate 604/104 may be composed of a polymer, ceramic, glass, or semiconductor material. In some embodiments, package substrate 604/104 may be a conventional cored substrate and/or an interposer.

In some embodiments, interposer 201/221 is provided between circuit board 622 and substrate 604. Interposer 201/221 of the various embodiments may be formed of a variety of materials. For example, interposer 201/221 may be formed of an epoxy resin, a fiberglass-reinforced epoxy resin, a ceramic material, or a polymer material such as polyimide. In some embodiments, interposer 201/221 may be formed of alternate rigid or flexible materials, such as silicon, germanium, and other group III-V and group IV materials of the Periodic Table. In some embodiments, interposer 201/221 may include metal interconnects and vias including but not limited to TSVs. In some embodiments, interposer 201 may include embedded devices including both passive and active devices. Such devices may include, but are not limited to, capacitors, decoupling capacitors, resistors, inductors, fuses, diodes, transformers, sensors, ESD devices, and memory devices. In some embodiments, interposer 201/221 may include complex devices such as RF devices, power amplifiers, power management devices, antennas, arrays, sensors, and MEMS devices, etc. In some embodiments, package interconnects 612*a*/203 may couple electrical routing features 610*a* disposed on the second side of package substrate 604 to corresponding electrical routing features 616*a* on interposer 201.

In some embodiments, circuit board (or motherboard) 622/101 may be a PCB composed of an electrically insulative material such as an epoxy laminate. For example, circuit board 622 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material.

Structures such as traces, trenches, and vias (which are not shown here) may be formed through the electrically insulating layers to route the electrical signals of First die 601 through the circuit board 622. Circuit board 622 may be composed of other suitable materials in other embodiments. In some embodiments, circuit board 622 may include other electrical devices coupled to the circuit board that are configured to route electrical signals to or from First die 601 through circuit board 622. In some embodiments, circuit board 622 may be a motherboard.

In some embodiments, a one side of interposer 201/221 is coupled to the second side of substrate 604/104 via routings 616*a*, 612*a*, and 610*a*. In some embodiments, another side of interposer 201/221 is coupled to circuit board 622 by package interconnects 610*b*, 612*b*/102, and 616*b*.

In some embodiments, package substrate 604 may have electrical routing features formed therein to route electrical signals between First die 601 (and/or the Second die 602) and circuit board 622 and/or other electrical components external to the IC package assembly. For example, electrical routing features pass through extended section 104*a* to top-side connector 224. In some embodiments, package interconnects 612*a/b* and die interconnects 606 include any of a wide variety of suitable structures and/or materials including, for example, bumps, pillars or balls formed using metals, alloys, solderable material, or their combinations. In some embodiments, electrical routing features 610 may be arranged in a ball grid array ("BGA") or other configuration. In some embodiments, substrate 604/104 has an extended region 104a to hold top-side connector 224. In some embodiments, interposer 201 has an extended region 221 to provide support for the extended substrate region 104a. In some embodiments, package interconnect and contacts 612a/203 and 610a are also placed under the extended region 104a to provide mechanical support to the extended region 104a. In some embodiments, top-side connector 224 is coupled to the extended region 104a.

Figure 7:
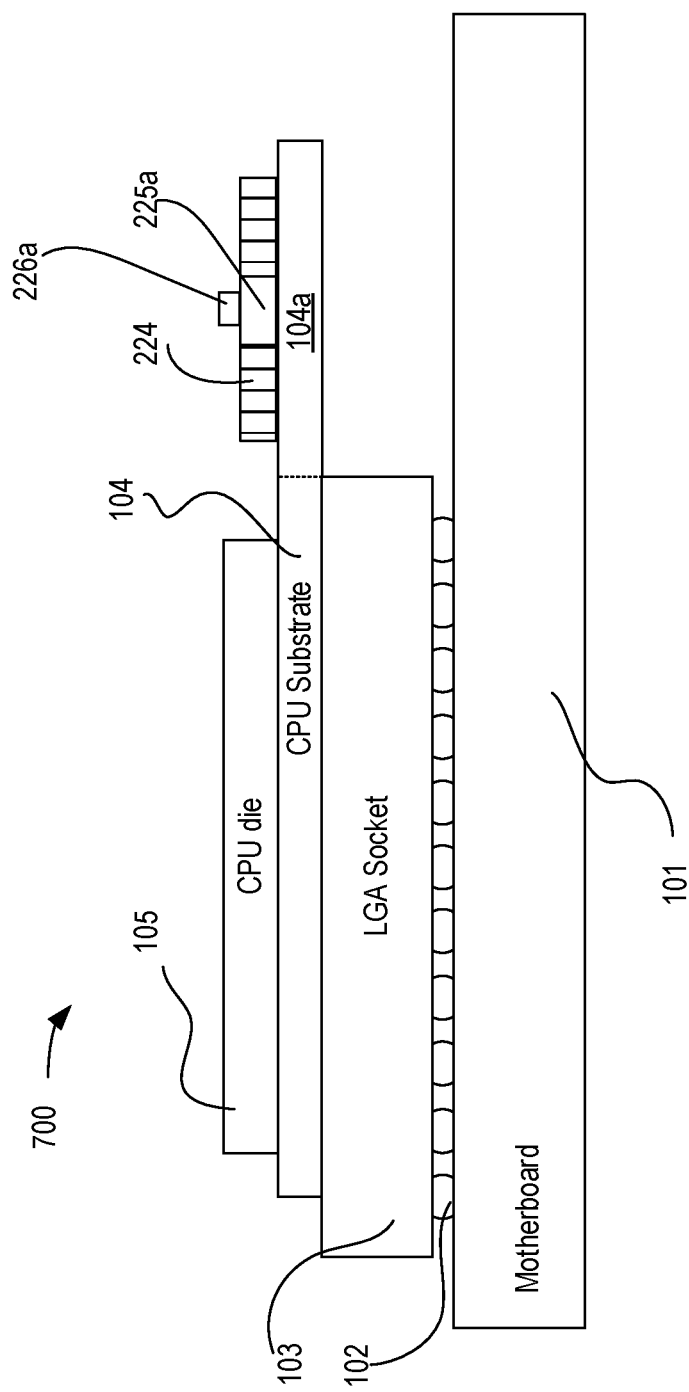
FIG. 7 illustrates a cross-sectional view of a socket packaging system with a processor substrate having an extended region to couple to a top-side connector, according to some embodiments of the disclosure.

FIG. 7 illustrates cross-sectional view 700 of a socket packaging system with a processor substrate having an extended region to couple to top-side connector, according to some embodiments of the disclosure. It is pointed out that those elements of FIG. 7 having the same reference numbers (or names) as the elements of any other figure can operate or function in any manner similar to that described, but are not limited to such. In some embodiments, instead of an LEC connector 106 of FIG. 1, top-side connector may be desired. In one such embodiment, top-side connector 224 is fastened on the extended region 104a of CPU substrate 104. The remaining figure is similar to FIG. 1.

Figure 8:
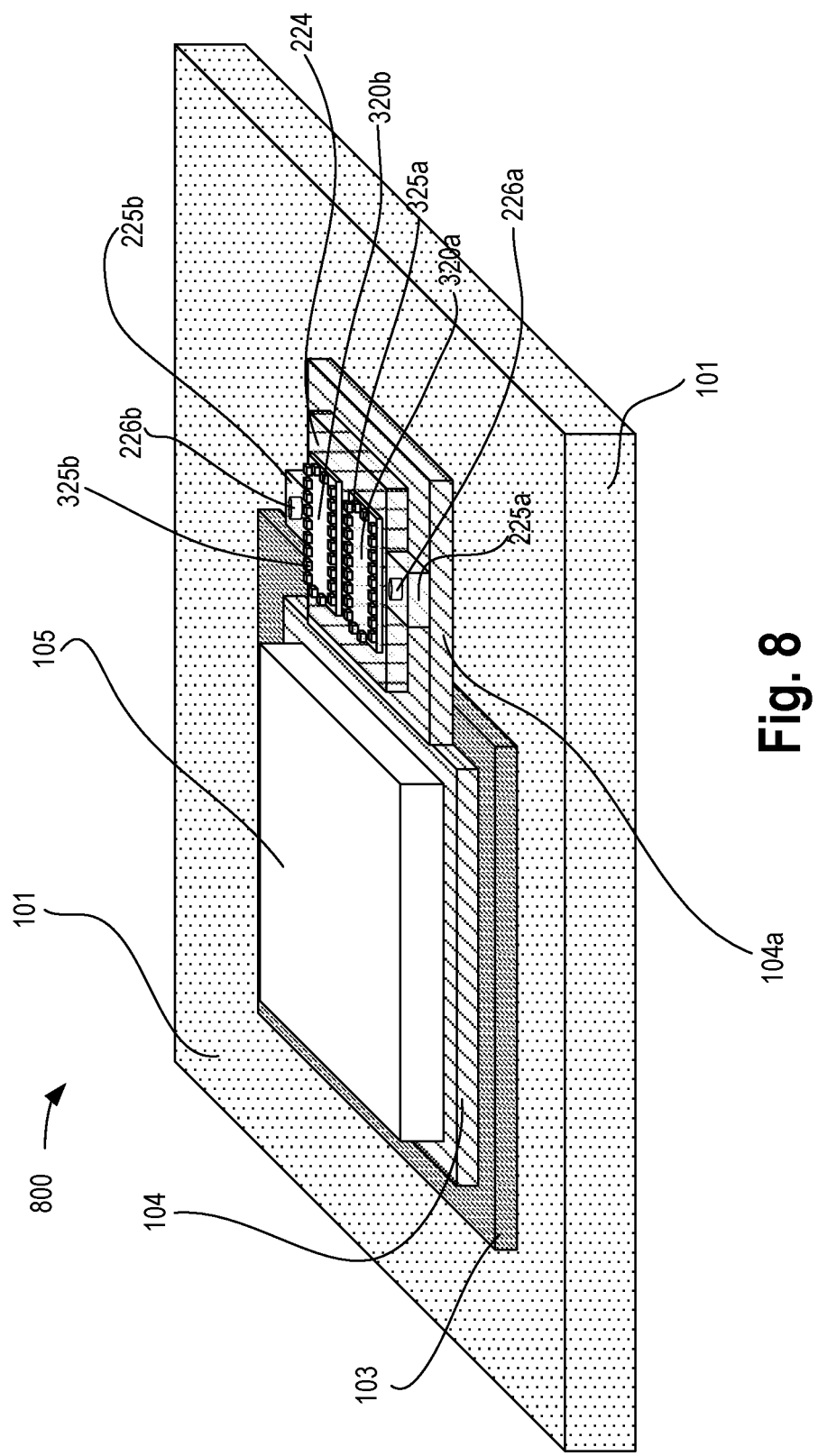
FIG. 8 illustrates a perspective view of the packaging system of FIG. 7, according to some embodiments of the disclosure.

FIG. 8 illustrates perspective view 800 of the packaging system of FIG. 7, according to some embodiments of the disclosure. It is pointed out that those elements of FIG. 8 having the same reference numbers (or names) as the elements of any other figure can operate or function in any manner similar to that described, but are not limited to such.

Perspective view 800 illustrates top-side connector 224 having two connection regions 320a and 320b, respectively, which attach to extended CPU substrate region 104a. These connection regions have connectors 325a and 325b which are used to couple to another device (e.g., a flexible interconnect fabric). Here, CPU substrate 104 couples to motherboard 101 via socket 103 (e.g., LGA socket). In some embodiments, both connectors 325a and 325b are male connectors. In some embodiments, both connectors 325a and 325b are female connectors. In some embodiments, one of the connectors (e.g., 325a) is a female connector and the other connector (e.g., 325b) is male connector. These connectors are electrically connected to signal routings from CPU die 105 via CPU substrate 104 and extended region 104a. In some embodiments, connector 225 is fastened to the extended region 104a of CPU substrate 104 via fasteners (e.g., screws) 226a and 226b which are insert-able in their respective regions 225a and 225b. While perspective view 800 illustrates one top-side connector 224 coupling to one side of CPU substrate 104, top-side connectors can be coupled to other sides of CPU substrate 104. For example, the packing system may include extended substrate regions along the north, west, and/or south sides of CPU substrate 104, and these extended regions may couple to their respective connectors.

The various embodiments described here are not limited to any one kind of packing technology. The top-side connector of various embodiments can be coupled to any processor package (e.g., ball grid array (BGA) package, pin grid array (PGA), flip-chip PGA (FCPGA), staggered PGA (SPGA), ceramic PGA (CPGA), organic PGA (OPGA), stud grid arrau (SGA), reduced PGA (rPGA), LGA, etc.).

Figure 9:
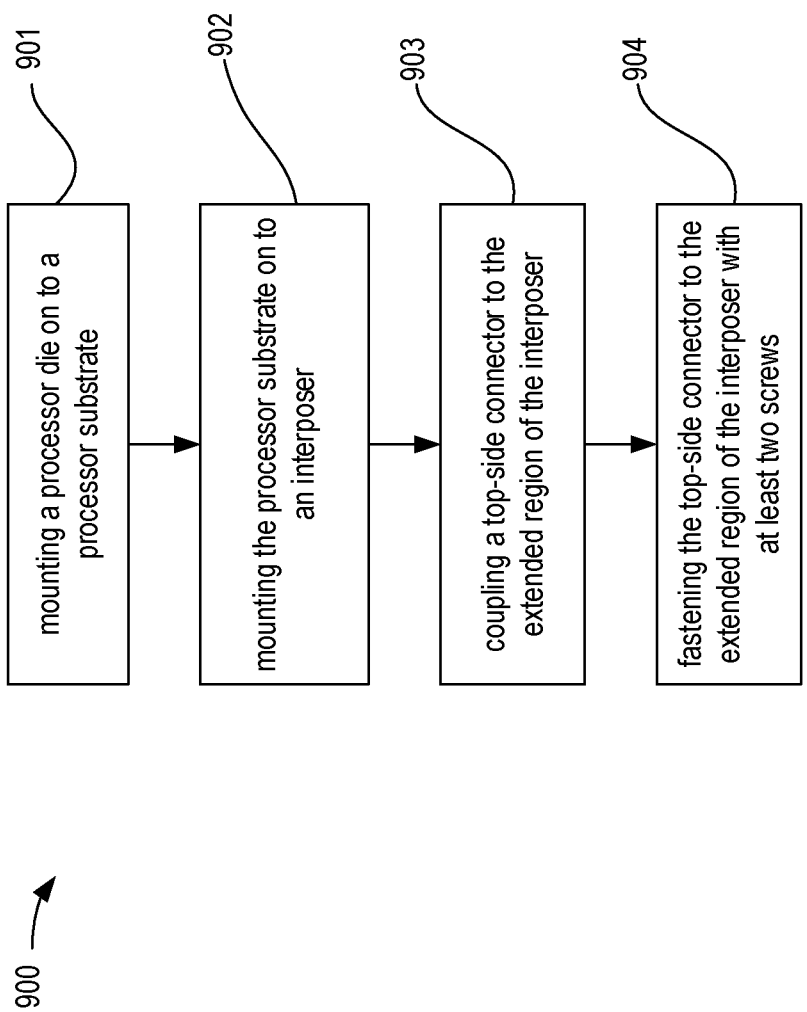
FIG. 9 illustrates a flowchart of a method of forming the package system, in accordance with some embodiments.

FIG. 9 illustrates flowchart 900 of a method of forming the package system, in accordance with some embodiments. It is pointed out that those elements of FIG. 9 having the same reference numbers (or names) as the elements of any other figure can operate or function in any manner similar to that described, but are not limited to such. Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 901, processor die 105 is mounted on processor substrate layer 104. At block 902, processor substrate 104 is mounted to interposer 201. Here, interposer has a region 221a which is extended away from processor substrate 104, where extended region 221a of interposer 201 has at least one signal path communicatively coupled to processor die 105, and where extended region 221a of interposer 221 is connectable to top-side connector 224. At block 903, top-side connector 224 is coupled to extended region 221a of the interposer 201. At block 904, top-side connector 224 is fastened to extended region 221a via at least two screws 226a and 226b.

Figure 10:
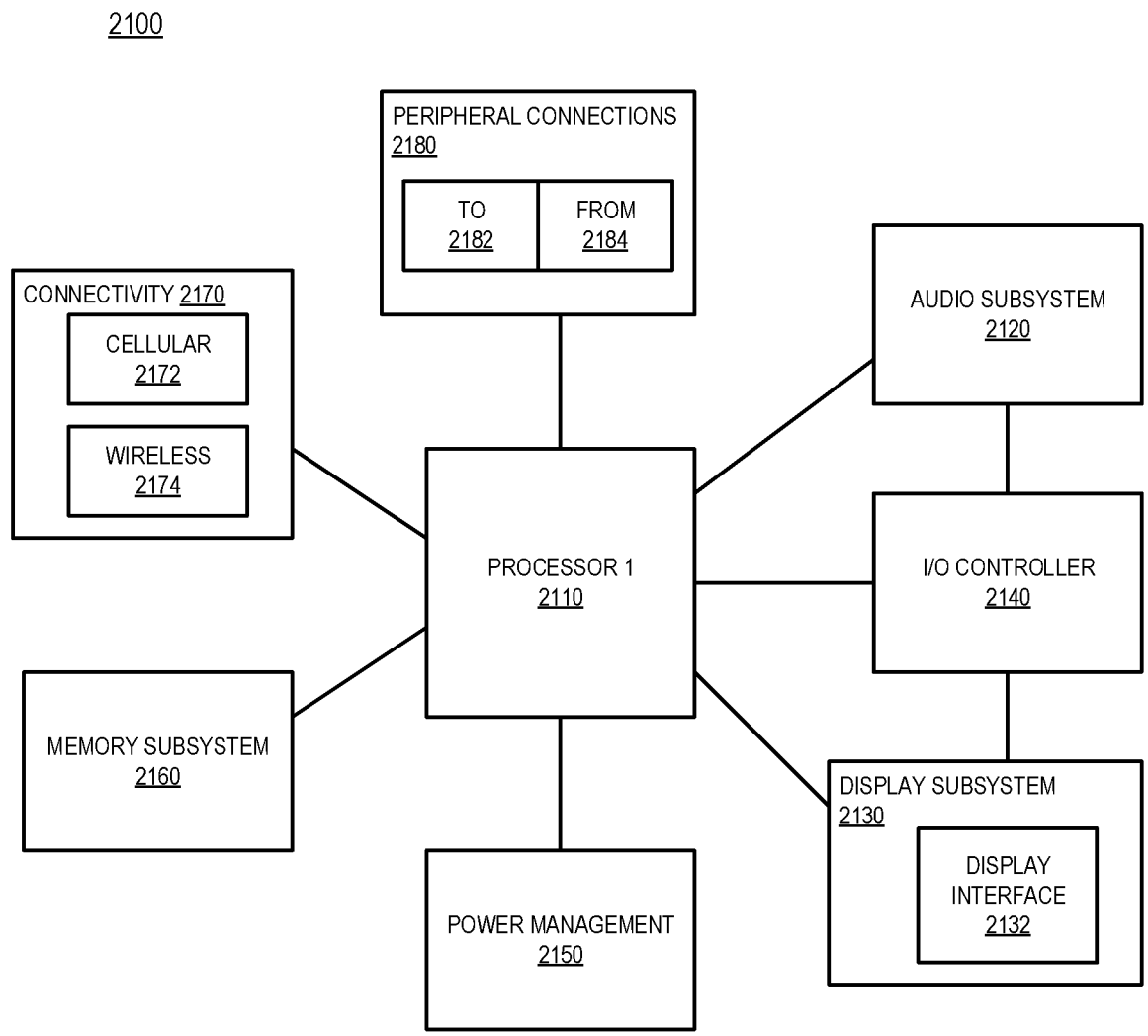
FIG. 10 illustrates a smart device or a computer system or a SoC (System-on-Chip) which is packaged and connectable to a top-side connector, according to some embodiments.

FIG. 10 illustrates a smart device or a computer system or a SoC (System-on-Chip) 2100 which is packaged and connectable to a top-side connector, according to some embodiments. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 2100 includes a first processor 2110 (e.g., First die 601). The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), Display- Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a processor die; a processor substrate having a region extended away from the processor die, wherein the processor die is mounted on the processor substrate, wherein the extended region has at least one signal interface which is connectable to a top-side connector; and an interposer coupled to the processor substrate and a motherboard. In some embodiments, the interposer is extended along the direction of the extended region of the processor substrate. In some embodiments, the interposer is a reflow grid array (RGA). In some embodiments, the RGA has heat traces to distribute heat uniformly in the RGA. In some embodiments, the RGA has heat traces to evenly distribute heat to allow ball grid array (BGA) balls to reflow and attach a BGA to the RGA. In some embodiments, the processor substrate is a substrate of a ball grid array (BGA). In some embodiments, the top-side connector has screws to fasten the top-side connector to the processor substrate.

In another example, an apparatus is provided which comprises: a processor die; a processor substrate coupled to the processor die; and an interposer coupled to the processor substrate and a motherboard, wherein the interposer has a region which is extended away from the processor substrate, wherein the extended region of the interposer has at least one signal path communicatively coupled to the processor die, and wherein the extended region of the interposer is connectable to a top-side connector. In some embodiments, the interposer is a reflow grid array (RGA). In some embodiments, the RGA has heat traces to distribute heat uniformly in the RGA. In some embodiments, the processor substrate is a substrate of a ball grid array (BGA). In some embodiments, the top-side connector has screws to fasten the top-side connector to the interposer.

In another example, a system is provided which comprises: a memory; a processor die coupled to the memory; a package encasing the processor die, the package including: a processor substrate coupled to the processor die; and an interposer coupled to the processor substrate and a motherboard, wherein the interposer has a region which is extended away from the processor substrate, wherein the extended region of the interposer has at least one signal path communicatively coupled to the processor die, and wherein the extended region of the interposer is connectable to a top-side connector; and a wireless interface for allowing the processor to communicate with another device. In some embodiments, the interposer is a reflow grid array (RGA). In some embodiments, the RGA has heat traces to distribute heat uniformly in the RGA. In some embodiments, the processor substrate is a substrate of a ball grid array (BGA). In some embodiments, the top-side connector has screws to fasten the top-side connector to the interposer.

In another example, a method is provided which comprises: mounting a processor die on to a processor substrate; mounting the processor substrate on to an interposer, wherein the interposer has a region which is extended away from the processor substrate, wherein the extended region of the interposer has at least one signal path communicatively coupled to the processor die, and wherein the extended region of the interposer is connectable to a top-side connector; and coupling a top-side connector to the extended region of the interposer. In some embodiments, fastening the top-side connector to the extended region of the interposer with at least two screws. In some embodiments, the interposer is a reflow grid array (RGA). In some embodiments, the processor substrate is a substrate of a ball grid array (BGA).

In another example, an apparatus is provided which comprises: means for mounting a processor die on to a processor substrate; means for mounting the processor substrate on to an interposer, wherein the interposer has a region which is extended away from the processor substrate, wherein the extended region of the interposer has at least one signal path communicatively coupled to the processor die, and wherein the extended region of the interposer is connectable to a top-side connector; and means for coupling a top-side connector to the extended region of the interposer. In some embodiments, the apparatus comprises means for fastening the top-side connector to the extended region of the interposer with at least two screws. In some embodiments, the interposer is a reflow grid array (RGA). In some embodiments, the processor substrate is a substrate of a ball grid array (BGA).

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a processor die;
a processor substrate coupled to the processor die; and
an interposer coupled to the processor substrate and a motherboard, wherein the interposer has a region which is extended away from the processor substrate, wherein the extended region of the interposer has at least one signal path communicatively coupled to the processor die, wherein the extended region of the interposer is configured to be directly connected to a top-side connector via an interface on the interposer, and wherein the interface is closer in proximity to the motherboard than the processor die is to the motherboard.

2. The apparatus of claim 1, wherein the interposer comprises a reflow grid array (RGA).

3. The apparatus of claim 2, wherein the RGA has heat traces to distribute heat uniformly in the RGA.

4. The apparatus of claim 3, wherein the processor substrate is a substrate of a ball grid array (BGA).

5. The apparatus of claim 4, wherein the top-side connector has screws to fasten the top-side connector to the interposer.

6. A system comprising:
a memory;
a processor die coupled to the memory;
a package encasing the processor die, the package including:
a processor substrate coupled to the processor die; and
an interposer coupled to the processor substrate and a motherboard, wherein the interposer has a region which is extended away from the processor substrate, wherein the extended region of the interposer has at least one signal path on the extended region of the processor substrate communicatively coupled to the processor die, wherein the extended region of the interposer is configured to be directly connected to a top-side connector at an interface on the interposer, wherein the interface is along a different plane than a plane of the processor die via an interface, and wherein the interface is closer in proximity to the motherboard than the processor die is to the motherboard; and
a wireless interface to allow the processor to communicate with another device.

7. The system of claim 6, wherein the interposer comprises a reflow grid array (RGA).

8. The system of claim 7, wherein the RGA has heat traces to distribute heat uniformly in the RGA.

9. The system of claim 8, wherein the processor substrate is a substrate of a ball grid array (BGA).

10. The system of claim 6, wherein the top-side connector has screws to fasten the top-side connector to the interposer.

11. A method comprising:
mounting a processor die on to a processor substrate;
mounting the processor substrate on to an interposer, wherein the interposer has a region which is extended away from the processor substrate, wherein the extended region of the interposer has at least one signal path communicatively coupled to the processor die, wherein the at least one signal path is along a same plane as the processor die, and wherein the extended region of the interposer is configured to be directly connected to a top-side connector; and
coupling a top-side connector to the extended region of the interposer.

12. The method of claim 11 comprises fastening the top-side connector to the extended region of the interposer with at least two screws.

13. The method of claim 11, wherein the interposer comprises a reflow grid array (RGA), and wherein the processor substrate comprises a substrate of a ball grid array (BGA).

* * * * *